United States Patent
Huang et al.

(10) Patent No.: US 7,047,759 B1
(45) Date of Patent: May 23, 2006

(54) LIQUID COOLING SYSTEM

(75) Inventors: Jung Fong Huang, Sanchong (TW); Chih Chien Huang, Sansia (TW)

(73) Assignee: Forward Electronics Co., Ltd., Taipei (TW)

( * ) Notice: Subject to any disclaimer, the term of this patent is extended or adjusted under 35 U.S.C. 154(b) by 0 days.

(21) Appl. No.: 11/194,672

(22) Filed: Aug. 2, 2005

(30) Foreign Application Priority Data

Mar. 18, 2005 (TW) ............................... 94108392 A

(51) Int. Cl.
*F25D 17/06* (2006.01)
(52) U.S. Cl. .............................. 62/426; 62/171; 62/314
(58) Field of Classification Search .................. 62/171, 62/314, 411, 419; 165/104.33, 80.3
See application file for complete search history.

(56) References Cited

U.S. PATENT DOCUMENTS

| | | | | |
|---|---|---|---|---|
| 3,719,051 A | * | 3/1973 | Malaker | 62/6 |
| 5,940,270 A | * | 8/1999 | Puckett | 361/699 |
| 6,604,576 B1 | * | 8/2003 | Noda et al. | 165/202 |
| 6,755,044 B1 | * | 6/2004 | Hildebrandt | 62/276 |

* cited by examiner

*Primary Examiner*—Melvin Jones
(74) *Attorney, Agent, or Firm*—Bacon & Thomas

(57) ABSTRACT

A liquid cooling system is disclosed to include a first cooler module, a second cooler module, a connecting tube connected between the vertically arranged coiled tube of the first cooler module and the vertically arranged coiled tube of the second cooler module, a working liquid passing through the coiled tubes of the two cooler modules, and an electric fan set in between the two cooler modules to suck air into the first cooler module and to blow air into the second cooler module, enhancing the heat dissipation effect.

5 Claims, 3 Drawing Sheets

LIQUID COOLING SYSTEM

BACKGROUND OF THE INVENTION

1. Field of the Invention

The present invention to a cooling system and more particularly, to a liquid cooling system.

2. Description of Related Art

In regular electronic products, heat energy produced during operation must be effectively expelled, keeping normal working of the products.

In a computer, the CPU is the main heat generating source. A CPU cooler may be used and attached to the CPU for dissipating heat from the CPU. This CPU cooler is comprised of a cooler module and an electric fan. The cooler module has cooling water flowing therein to carry heat energy by means of heat pipe theory, enabling heat energy to be dissipated into the outside open air by means of the suction or blowing action of the electric fan.

FIG. 1 shows a liquid cooling system according to the prior art. According to this design, the liquid cooling system comprises a first cooler module 91 and a second cooler module 92 arranged in parallel, and an electric fan 93 fastened to one side of the first cooler module 91 opposite to the second cooler module 92. During operation of the electric fan to suck or blow air, the flow of air is reduced when entering the second cooler module 92, resulting in a low heat dissipation effect.

Further, because the first cooler module 91 has a coiled tube 911 installed therein and the second cooler module 92 has a coiled tube 921 installed therein, the coiled tubes 911 and 921 hinder the flowing of air, resulting in a high wind resistance, which lowers the performance of the cooling system.

SUMMARY OF THE INVENTION

The present invention has been accomplished under the circumstances in view. According to the present invention, the liquid cooling system comprises a first cooler module, a second cooler module, a connecting tube, and an electric fan.

The first cooler module comprises a plurality of first radiation fins and a first coiled tube. The first radiation fins of the first cooler module are transversely arranged in parallel at a predetermined pitch. The first coiled tube is vertically inserted through the first radiation fins of the first cooler module, having a first inlet and a first outlet.

The second cooler module is arranged in parallel with the first cooler module, comprising a plurality of second radiation fins and a second coiled tube. The second radiation fins of the second cooler module are transversely arranged in parallel at a predetermined pitch. The second coiled tube of the second cooler module is vertically inserted through the second radiation fins of the second cooler module, having a second inlet and a second outlet.

The connecting tube is connected between the first outlet of the first coiled tube of the first cooler module and the second inlet of the second coiled tube of the second cooler module.

Further, the electric fan is set in between the first cooler module and the second cooler module, having an air flowing portion facing one of the first cooler module and the second cooler module and an air outflowing portion facing the other of the first cooler module and the second cooler module.

As indicated above, the electric fan is set in between the first cooler module and the second cooler module to suck air into one of the first cooler module and the second cooler module and to blow air into the other of the first cooler module and the second cooler module, thereby dissipating heat from the first coiled tube of the first cooler module and the second coiled tube of the second coiled tube. During operation of the electric fan, the first coiled tube and the second coiled tube do not block sucking air and blowing air, i.e., the wind resistance of the electric fan is effectively reduced, improving the heat dissipation effect of the whole system.

Further, the first radiation fins of the first cooler module each have a plurality of vertically extending first through holes for receiving the first coiled tube of the first cooler module. Similarly, the second radiation fins of the second cooler module each have a plurality of vertically extending second through holes for receiving the second coiled tube of the second cooler module.

Further, a working liquid is provided to flow into the first inlet of the first coiled tube of the first cooler module and out of the second outlet of the second coiled tube of the second cooler module through via the first coiled tube of the first cooler module, the connecting tube and the second coiled tube of the second cooler module. The working liquid can be water, ethyl alcohol.

DETAILED DESCRIPTION OF THE PREFERRED EMBODIMENT

Figure 1:
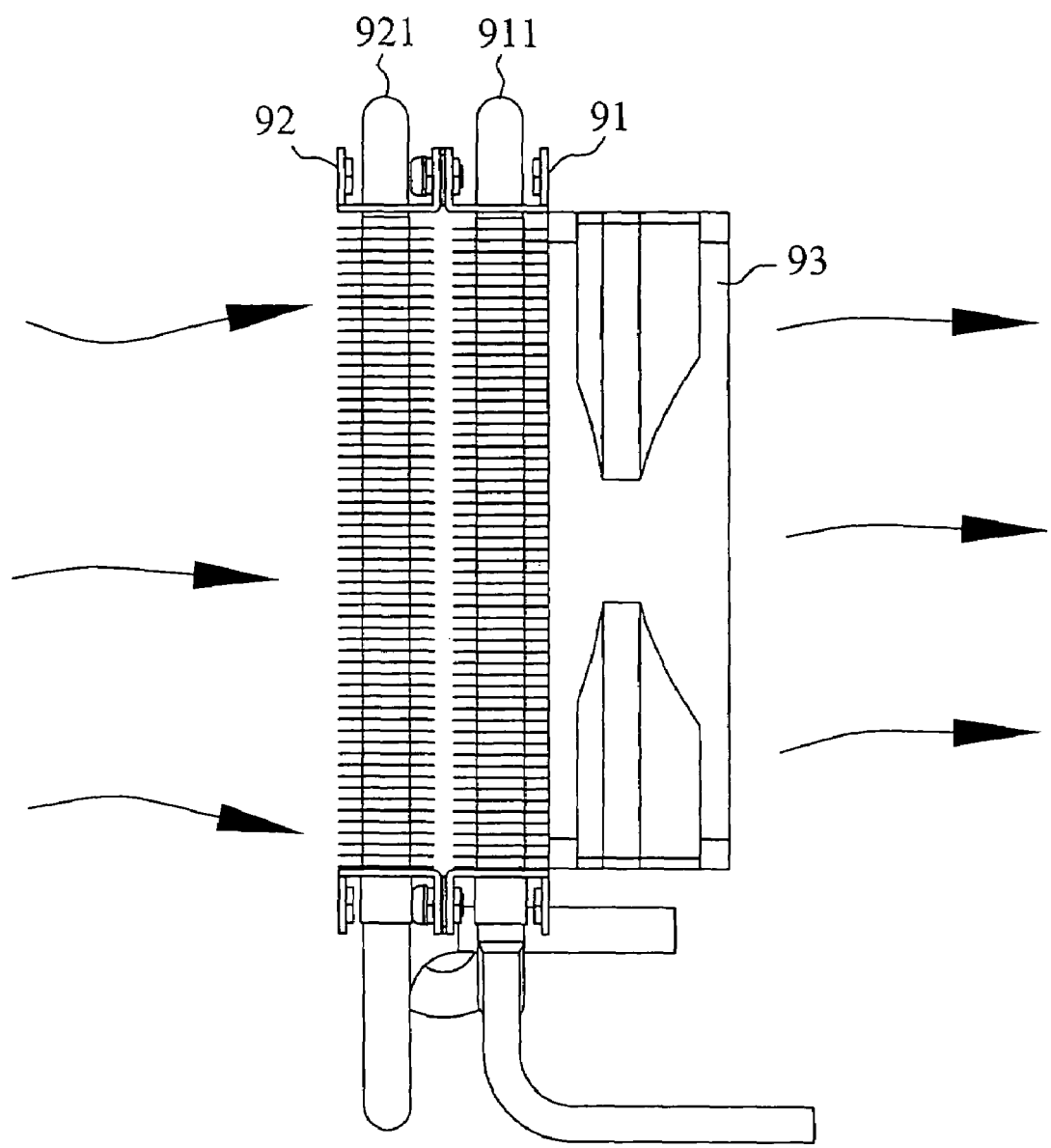
FIG. 1 is a schematic drawing of a liquid cooling system according to the prior art.
Figure 2:
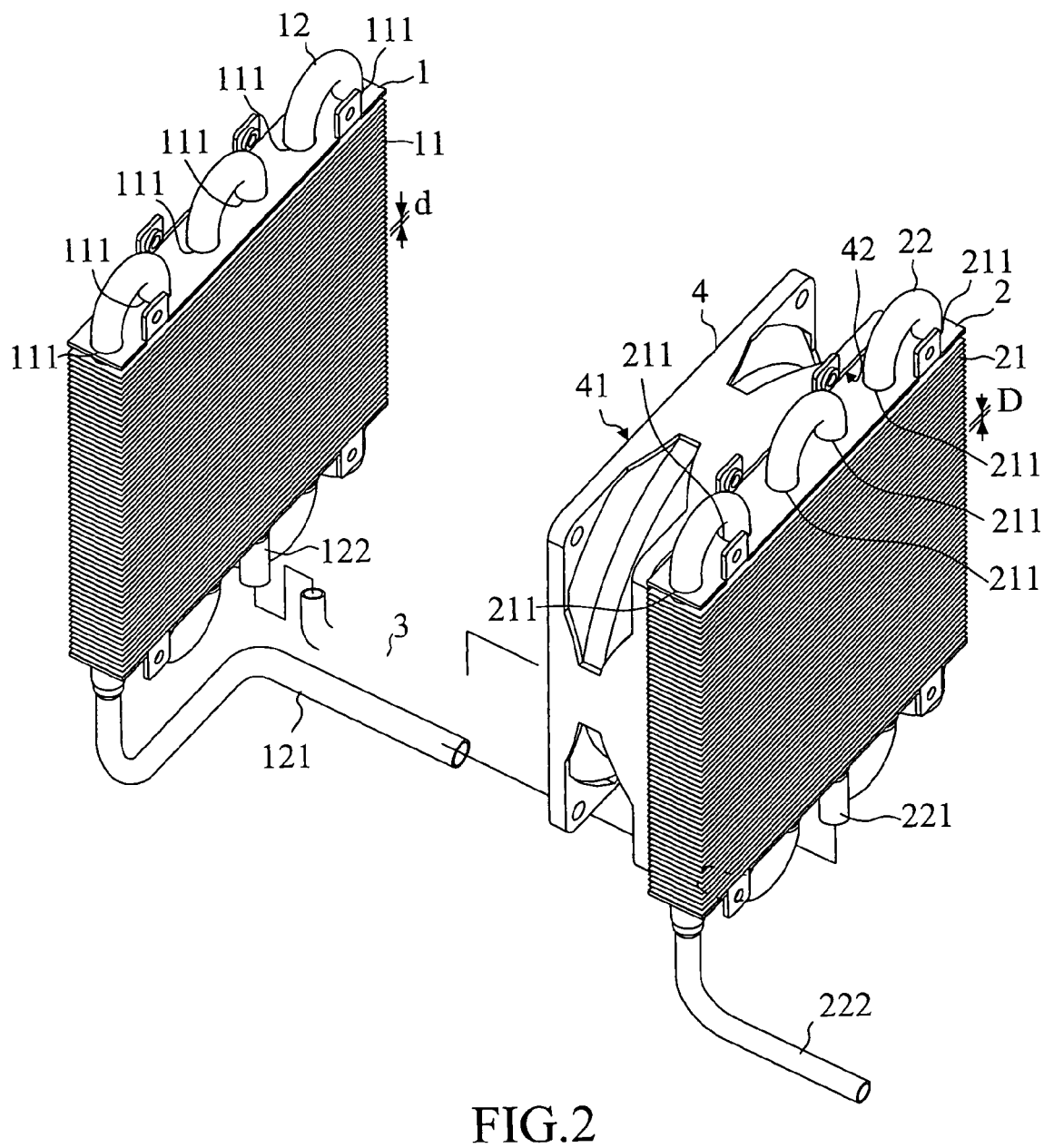
FIG. 2 is an exploded view of a liquid cooling system according to the present invention.
Figure 3:
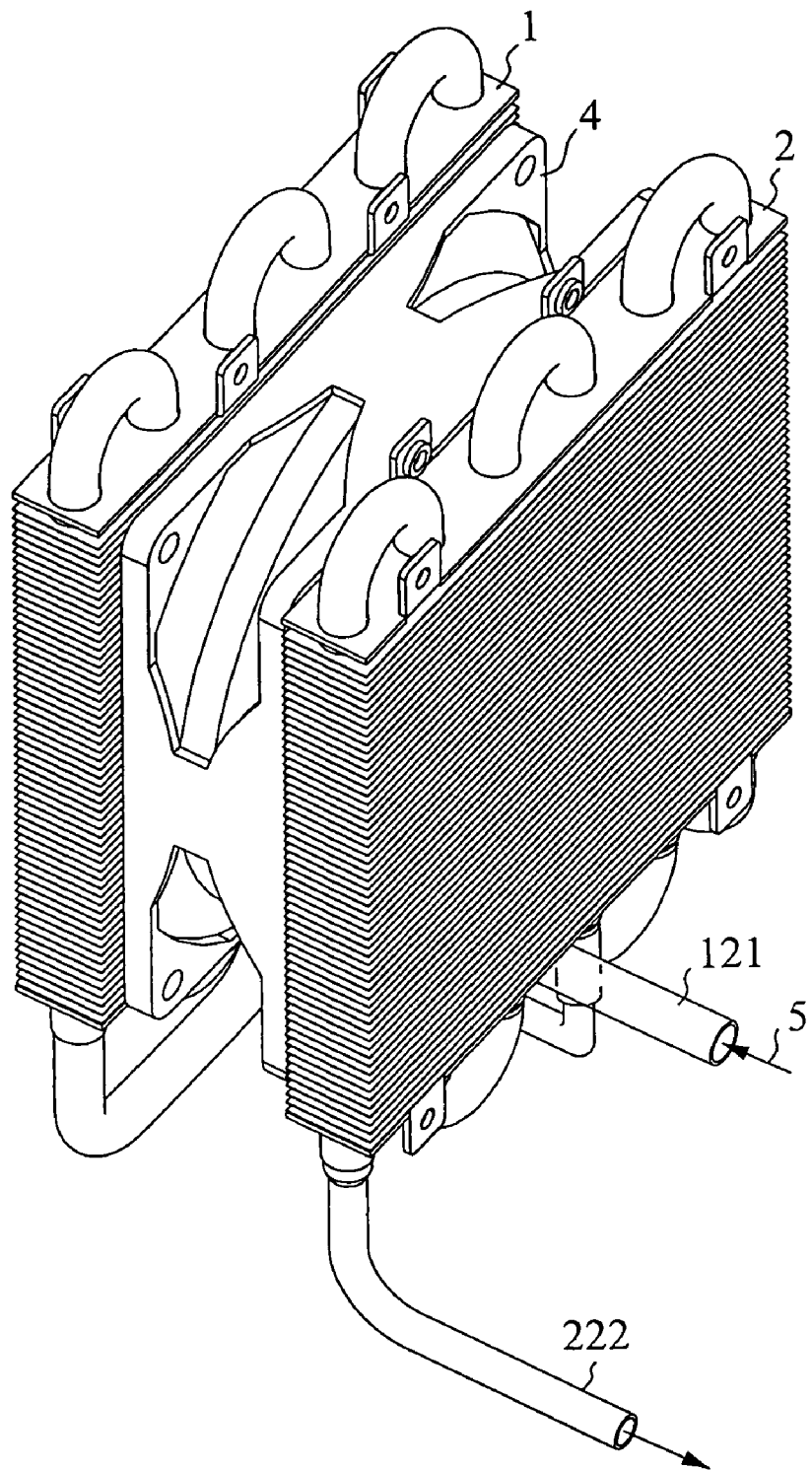
FIG. 3 is an elevational assembly view of the liquid cooling system according to the present invention.

Referring to FIG. 2 and FIG. 3, a liquid cooling system in accordance with the present invention is shown comprised of a first cooler module 1, a second cooler module 2, a connecting tube 3, and an electric fan 4.

The first cooler module 1 comprises a plurality of first radiation fins 11 and a first coiled tube 12. The first radiation fins 11 are transversely arranged in parallel at a predetermined pitch d, each having a plurality of vertically extending first through holes 111. The first coiled tube 12 is a continuously S-shaped tube vertically inserted through the vertically extending first through holes 111 of the first radiation fins 11, having a first inlet 121 and a first outlet 122.

The second cooler module 2 is arranged in parallel with the first cooler module 1 at one side, comprising a plurality of second radiation fins 21 and a second coiled tube 22. The second radiation fins 21 are transversely arranged in parallel at a predetermined pitch D, each having a plurality of vertically extending second through holes 211. The second coiled tube 22 is a continuously S-shaped tube vertically inserted through the vertically extending second through holes 211 of the second radiation fins 21, having a second inlet 221 and a second outlet 222.

The connecting tube 3 is connected between the first outlet 122 of the first coiled tube 12 of the first cooler module 1 and the second inlet 221 of the second coiled tube 22 of the second cooler module 2. The electric fan 4 is set and sandwiched in between the first cooler module 1 and the second cooler module 2, having an air flowing portion 41 facing the first cooler module 1 and an air outflowing portion 42 facing the second cooler module 2.

During cooling operation, a working liquid (for example, pure water) 5 is guided through the first inlet 121 into the first coiled tube 12 of the first cooler module 1, enabling the working liquid 5 to flow out of the first coiled tube 12 of the first cooler module 1 through the connecting tube 3 into the second coiled tube 22 of the second coiled tube 2 and then to flow out of the second coiled tube 2 through the second outlet 222. Therefore, the working liquid 5 passes During flowing of the working liquid 5 through the first cooler module 1 and the second cooler module 2, the electric fan 4 is operated to suck air into the first cooler module 1 and to flow air into the second cooler module 2. Therefore, heat energy from the heat source is carried by the working liquid 5 to the first coiled tube 12 of the first cooler module 1 and the second coiled tube 22 of the second cooler module 2 and then dissipated into the outside open air by means of the air suction and air blowing actions of the electric fan 4.

As indicated above, the electric fan 4 is set in between the first cooler module 1 and the second cooler module 2 to suck air into the first cooler module 1 and to blow air into the second cooler module 2, thereby dissipating heat from the first coiled tube 12 of the first cooler module 1 and the second coiled tube 22 of the second coiled tube 2. During operation of the electric fan 4, the first coiled tube 12 and the second coiled tube 22 do not block sucking air and blowing air, i.e., the wind resistance of the electric fan 4 is effectively reduced, improving the heat dissipation effect of the whole system.

Although the present invention has been explained in relation to its preferred embodiment, it is to be understood that many other possible modifications and variations can be made without departing from the spirit and scope of the invention as hereinafter claimed.

What is claimed is:

1. A liquid cooling system comprising:
    a first cooler module, said first cooler module comprising a plurality of first radiation fins transversely arranged in parallel at a predetermined pitch and a first coiled tube vertically inserted through the first radiation fins of said first cooler module, the first coiled tube of said first cooler module having a first inlet and a first outlet;
    a second cooler module, said second cooler module arranged in parallel with said first cooler module, said second cooler module comprising a plurality of second radiation fins transversely arranged in parallel at a predetermined pitch and a second coiled tube vertically inserted through the second radiation fins of said second cooler module, the second coiled tube of said second cooler module having a second inlet and a second outlet;
    a connecting tube connected between the first outlet of the first coiled tube of said first cooler module and the second inlet of the second coiled tube of said second cooler module; and
    an electric fan set in between said first cooler module and said second cooler module, said electric fan having an air inflowing portion facing one of said first cooler module and said second cooler module and an air outflowing portion facing the other of said first cooler module and said second cooler module.

2. The liquid cooling system as claimed in claim 1, wherein the first radiation fins of said first cooler module each have a plurality of vertically extending first through holes, the first coiled tube of said first cooler module is vertically inserted through the vertically extending first through holes of the first radiation fins of said first cooler module.

3. The liquid cooling system as claimed in claim 1, wherein the second radiation fins of said second cooler module each have a plurality of vertically extending second through holes, the second coiled tube of said second cooler module is vertically inserted through the vertically extending second through holes of the second radiation fins of said second cooler module.

4. The liquid cooling system as claimed in claim 1, further comprising a working liquid that flows from the first inlet of the first coiled tube of said first cooler module through the first coiled tube of said first cooler module, said connecting tube and the second coiled tube of said second cooler module to the outside of said second cooler module via the second outlet of the second coiled tube of said second cooler module.

5. The liquid cooling system as claimed in claim 4, wherein said working liquid is water.

\* \* \* \* \*